US012339137B2

(12) United States Patent
Hilbert et al.

(10) Patent No.: US 12,339,137 B2
(45) Date of Patent: Jun. 24, 2025

(54) HOUSING SEAL FOR A MEASURING INSTRUMENT

(71) Applicant: WIKA Alexander Wiegand SE & Co. KG, Klingenberg (DE)

(72) Inventors: Christoph Hilbert, Mudau-Steinbach (DE); Rolf Kaufmann, Schneeberg (DE)

(73) Assignee: Wika Alexander Wiegand SE & Co. KG, Klingenberg (DE)

( * ) Notice: Subject to any disclaimer, the term of this patent is extended or adjusted under 35 U.S.C. 154(b) by 103 days.

(21) Appl. No.: 18/223,590

(22) Filed: Jul. 19, 2023

(65) Prior Publication Data

US 2024/0027237 A1    Jan. 25, 2024

(30) Foreign Application Priority Data

Jul. 20, 2022  (DE) ...................... 10 2022 118 142.1

(51) Int. Cl.
    *G01D 11/24*    (2006.01)
(52) U.S. Cl.
    CPC .................................. *G01D 11/245* (2013.01)
(58) Field of Classification Search
    CPC .................................................... G01D 11/245
    See application file for complete search history.

(56) References Cited

U.S. PATENT DOCUMENTS

2015/0253230 A1 * 9/2015 Bloecher ................ G01N 33/20
                                                               73/82

FOREIGN PATENT DOCUMENTS

| CN | 114424409 A | * | 4/2022 | ........... H01R 13/502 |
| EP | 3441657 A1 | * | 2/2019 | ............... F16J 15/46 |
| GB | 2467650 A | * | 8/2010 | ............. F16J 15/322 |

* cited by examiner

*Primary Examiner* — Jamel E Williams
(74) *Attorney, Agent, or Firm* — Muncy, Geissler, Olds & Lowe, P.C.

(57) ABSTRACT

A housing for a measuring instrument comprising a housing part, a cover connectable to the housing part in a detachable manner and by means of which a housing opening of the housing part is closable, and a sealing element. The housing part has a central axis, which coincides congruently with a central axis of the cover when closed. The cover has at least one sealing surface on which the sealing element comes to rest at least when the housing part is completely closed. The housing part has at least one sealing surface on which the sealing element rests when the housing part is closed with the cover. A surface line of the sealing surface of the housing part and/or a surface line of the sealing surface of the cover are/is rotated with respect to the central axis, at least when the housing part is completely closed.

13 Claims, 8 Drawing Sheets

State of the Art

State of the Art

State of the Art

State of the Art

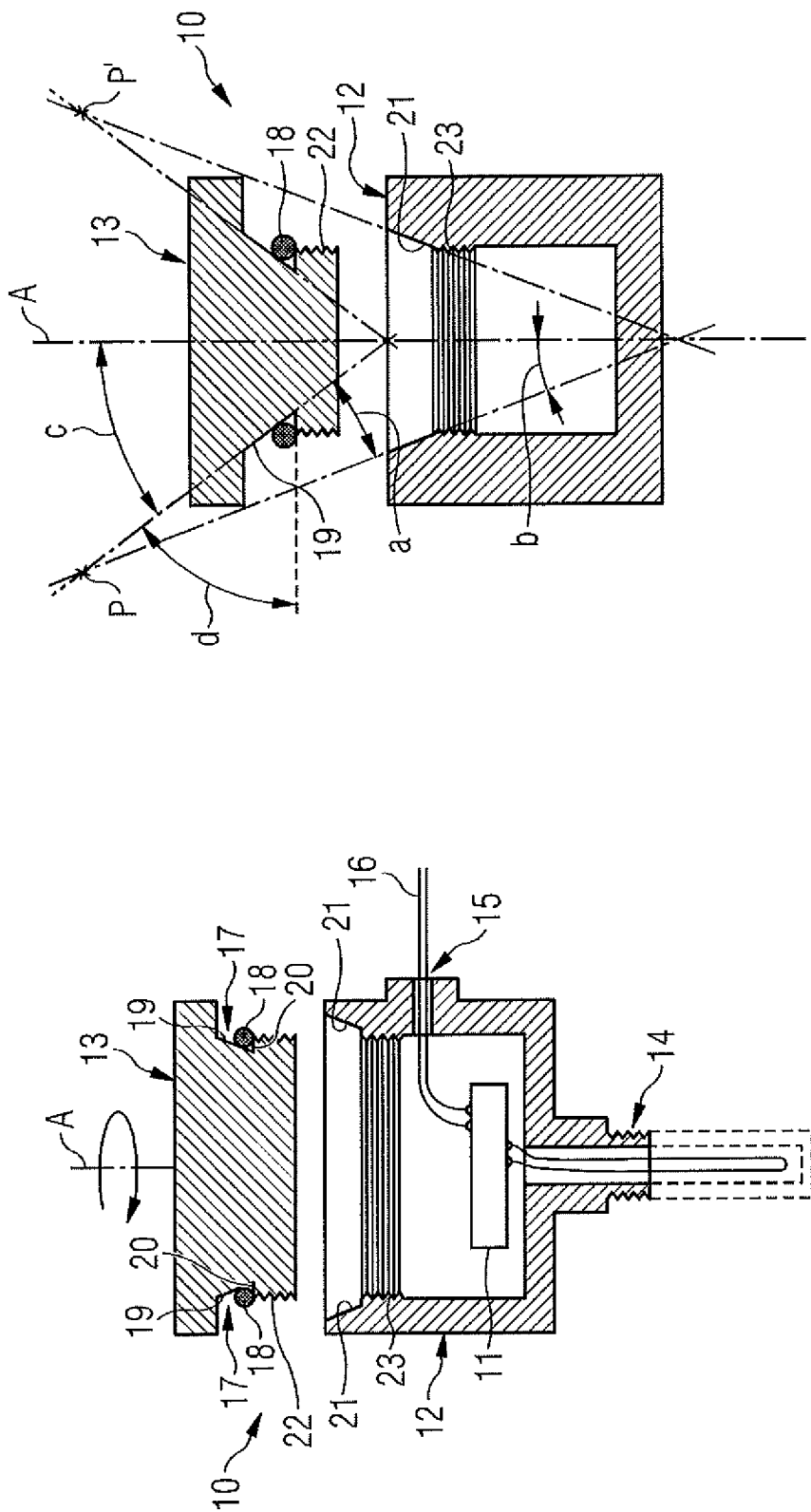

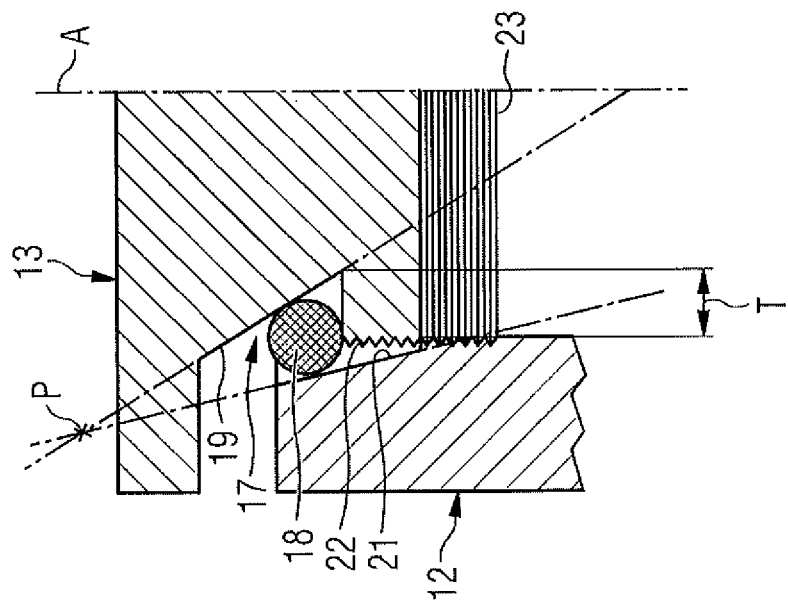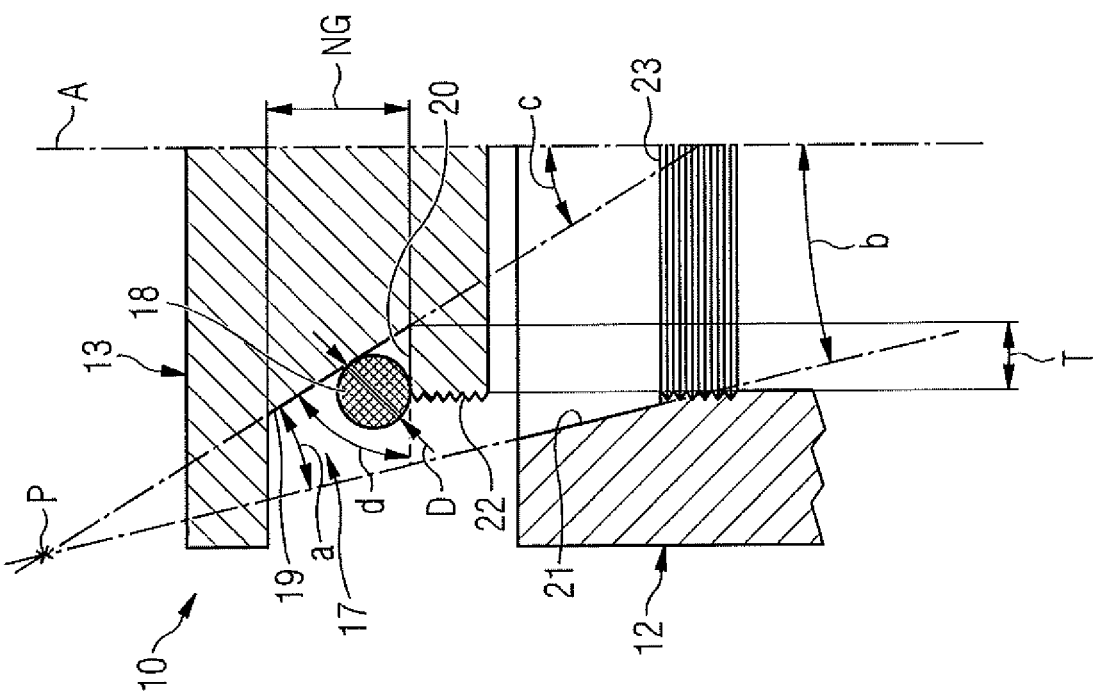

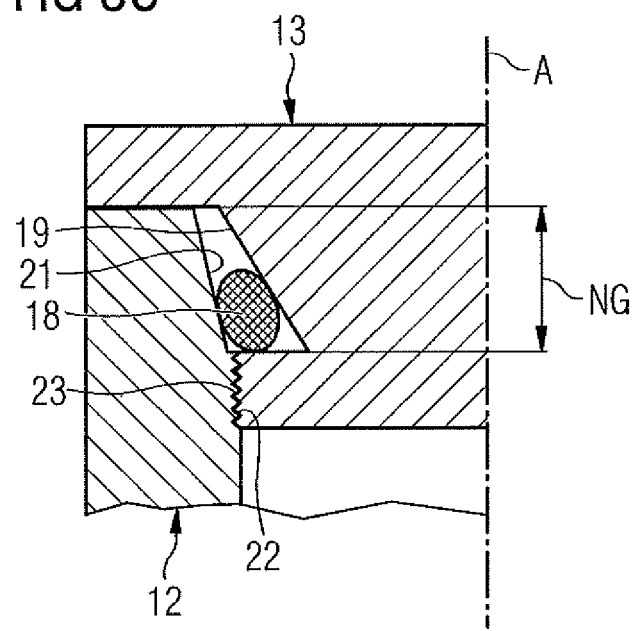

HOUSING SEAL FOR A MEASURING INSTRUMENT

This nonprovisional application claims priority under 35 U.S.C. § 119(a) to German Patent Application No. 10 2022 118 142.1, which was filed in Germany on Jul. 20, 2022, and which is herein incorporated by reference.

BACKGROUND OF THE INVENTION

Field of the Invention

The present invention relates to a housing for a measuring instrument as well as a method for sealing a housing for a measuring instrument.

Description of the Background Art

Housings for measuring instruments are mainly used in the process industry and are subject to high requirements in terms of sealing. On the one hand, the interior of the housing of sensitive measuring instruments is to be prevented from being impaired by external environmental influences, such as the ingress of moisture or dust. On the other hand, ignition sparks generated inside the housing are to be prevented from spreading outwards into an explosive atmosphere (environment). Accordingly, sealing such housings is crucial.

From the conventional art, two different sealing concepts are known. In both cases, a sealing element, especially an O-ring, is pressed between a cover and a housing part. This pressing can take place radially on the one hand, axially on the other.

In the axial seal, also known as a flange seal, the O-ring is pressed by the cover with an axial force. In the radial seal, such as a piston seal, the sealing effect occurs between a circumference of the O-ring and a sealing surface of a corresponding recess in the housing part.

SUMMARY OF THE INVENTION

It is therefore an object of the present invention to provide a novel housing for a measuring instrument and a novel method of sealing a housing for a measuring instrument.

In an example of the invention, a housing for a measuring instrument comprises a housing part and a cover, which can be connected to the housing part in a detachable manner and by means of which the housing opening of the housing part can be closed. Furthermore, the housing includes a sealing element. The housing part has a central axis, which coincides congruently with a central axis of the cover when the housing part is closed with the cover. The cover has at least one sealing surface on which the sealing element comes to rest at least when the housing is completely closed, i.e., for example when the cover is completely screwed into the housing part. In the congruent case, for example, only one central axis is always described. For example, the central axes can also be rotational axes, as is the case with a screw connection, for example. Furthermore, the housing part has at least one sealing surface on which the sealing element comes to rest when the housing part is closed with the cover.

This means, for example, that the sealing element can be arranged on at least one sealing surface or in a sealing contour of the cover. For example, the sealing surface can also be described in such a way that it lies at a tangent of a section of the sealing contour. For example, the tangent is placed through a point with the smallest curvature or the largest radius of the sealing contour. Several such sealing surfaces, angled to each other, optionally also provided with radii or a single constant radius, can define the so-called sealing contour. The sealing element is, for example, in contact with at least one sealing surface or with the sealing contour.

Furthermore, the housing part also has at least one sealing surface. Here, too, several sealing surfaces with different radii can form a sealing contour. When closing the housing part or the housing opening with the cover, the sealing element of the cover comes into contact with the at least one sealing surface or, optionally, the sealing contour.

A surface line of the sealing surface of the housing part and/or a surface line of the sealing surface of the cover can be interlaced with the central axis, at least when the housing is completely closed.

This means, for example, that the sealing surface of the housing part and/or the sealing surface of the cover can correspond, at least in sections, to a lateral surface of a truncated circular cone and that an axis of symmetry of the at least one virtual truncated circular cone surrounded by the corresponding sealing surface coincides congruently with the central axis of the housing part and/or the cover.

Thus, the interlacing is defined, for example, by the fact that the at least one sealing surface, in particular a surface line of the sealing surface, is not arranged parallel to the central axis of the housing part. An interlacing of both sealing surfaces, i.e., the sealing surface of the housing part and the sealing surface of the cover, can also be provided.

By interlacing the sealing surfaces to the central axis or to each other, screwdriving work can be significantly reduced, which is necessary to seal the housing in the best possible way. For a complete pressing of the sealing element, significantly fewer revolutions with increased force are required with the present solution than, for example, with the radial sealing concept. In addition, the geometry of the present housing seal has the advantage that maximum screwdriving work and thus the greatest force must only be applied shortly before the housing is completely sealed.

Axial and radial sealing concepts known from the state of the art sometimes have considerable disadvantages in their application or safety, especially with regard to their sealing effect. With the axial screw cap sealing principle with an O-ring, there is always a risk of rotating or slipping of the seal when using soft sealing materials. When using hard sealing materials, a tight seal can only be ensured in the long term with a high compression of the seal. Material behavior as well as compression set immediately cause a weakened seal. Such compression always requires the user to use a high torque.

With the radial sealing principle, analogous to a piston-cylinder seal, it is necessary to press the O-ring via a groove geometry. In the case of a classic, parallel groove design, the torque to be applied by the user from a complete O-ring engagement is constant. Depending on the selected compression and installation length, the torque required to press the O-ring can become uncomfortably high and long.

These latter disadvantages are overcome by the present housing seal due to the interlacing of the at least one sealing surface.

An angle can be formed between the surface line of at least one section of the sealing surface of the cover and the surface line of at least one section of the sealing surface of the housing part, which is in a range of 1 degree to 40 degrees or 3 degrees to 15 degrees. The advantage here also lies in the reduction of the screwdriving work and, in particular, the force to be applied. The compression increases continuously due to the angle of the sealing surfaces to each other. This means that the greatest force is only required at maximum compression and shortly before the complete closure of the housing part.

Another important measure can be an angle measured from the lateral line of the respective sealing surface to the central axis. Thus, the angle between the surface line of the sealing surface of the cover to the central axis can be about 15 degrees. The angle between the surface line of the sealing surface of the housing part and the central axis can be about 10 degrees.

The sealing surface of the cover is formed as a conical circumferential groove. In particular, a conical circumferential groove is understood to mean a groove that is formed 360 degrees, i.e., completely, around the cover. In cross-section, for example, the sealing surface forms a "V" that opens upwards or an upside-down cone.

Accordingly, an intersection of the surface line of the conical sealing surface is formed downwards in the direction of the housing part. By designing the sealing surface as a conical circumferential groove, the advantage is that the sealing element within the groove always remains at the point with the smallest diameter of the conical circumferential groove of the cover and cannot slip.

A cross-section of the conical circumferential groove of the cover can be reduced, in particular continuously, resulting in an angle between a (first) side wall of the groove and a groove base of less than 90 degrees.

The sealing surface of the housing part can run, at least in sections, coaxially to the central axis of the housing part, i.e., the surface line of the sealing surface of the housing part runs parallel to the central axis of rotation of the housing. In particular, the sealing surface of the cover and/or the sealing surface of the housing part may run concentrically to the central axis. Particularly advantageous here is a much simpler and more precise production.

The sealing surface of the housing part or the cover can be formed as a conical recess or as a chamfer. When the housing part is closed, an angle is formed between the sealing surfaces, i.e., between the surface lines of the sealing surfaces. Optionally, the surface line of the sealing surface of the respective opposite side, i.e., the opposite sealing surface, is also arranged at an angle or parallel to the central axis. For example, the surface line of the sealing surface of the cover can be parallel to the axis of rotation. In particular, the angle of the surface line of the sealing surface of the cover to the axis of rotation may be less than the angle of the surface line of the sealing surface of the housing part, measured to the central axis of rotation of the housing.

Also, the chamfer can be rounded at its ends or have rounded transitions to a thread. The sealing element can fit perfectly into it and be pressed evenly when the cover and the housing part are connected. This significantly increases service life and sealing quality.

The sealing element can be an O-ring made of rubber or a thermoplastic elastomer. O-rings are widely used sealing elements, making them ideal for use in housing sealing. A round cross-section of the O-rings is particularly advantageous, as they are pressed particularly evenly in the housing seal. The sealing surfaces can therefore not only contact two points on the O-ring, but also several points or even a large area.

The cover can be secured against rotating when the housing is closed. A safety lock against unintentional rotating, such as that triggered by vibrations, can ensure the housing is sealed. Furthermore, the safety lock can also be designed as a kind of end stop. This has the advantage that, on the one hand, the unintentional loosening of a screw connection of the cover in the housing part and, in particular, an unintentional loosening of the compression of the O-ring are prevented. On the other hand, it can also be indicated whether the cover has been completely screwed onto the housing part if the greatest sealing effect is only achieved with a complete screw connection.

The locking element can be insertable or inserted into a recess in the cover when the housing part is closed. The locking element can be arranged, for example, on the housing part, in particular so as to rotate. For example, the locking element may be a screw that is screwed into a corresponding threaded bore in the housing part.

The recess in the cover, for example, can be designed as a groove. For example, the groove is formed on a circumference of the cover on a circular segment of about 10 degrees to 90 degrees, in particular 20 degrees to 70 degrees. When the housing is closed, the locking element may form an end stop or an end position for the screw connection in or on the housing part of the cover.

Furthermore, optical indicators, such as printed markings, may be present in the area of the groove. These indicate, for example, an area in which the housing is sealed securely and in a pressure-tight manner. If the cover is screwed on or screwed into the housing part far enough, a locking element located between printed markings indicates that the housing is sufficiently sealed. This makes it particularly easy and quick to visually determine whether the housing is completely sealed.

An intersection area of imaginary extensions of the sealing surfaces of the housing part and the cover, with the housing opening not closed by the cover, but the cover arranged above the housing opening in the mounting direction and congruently coinciding central axes of the housing part and cover outside the housing part and outside the cover can be formed. This means that between the surface lines of at least one sealing surface of the sealing contour of the cover and at least one sealing surface of the housing part there is such an angle that the intersection of the legs of this angle is outside the housing part in the unsealed state of the housing. The intersection can be farther or closer to the housing part, depending on the size of the angle. Furthermore, the intersection can also be located to the side of the housing part or above the cover.

The intersection of the surface lines of the sealing surfaces, i.e., of the legs of the angle, can be located within the housing part in the sealed state of the housing. When sealing, in particular when closing the cover on the housing part, the sealing surface and/or the sealing contour of the cover shifts parallel in the direction of the housing part. As a result, the intersection of the legs of the angle moves closer to or into the housing part.

In a method for sealing an aforementioned housing, for example for measuring instruments, a housing part can be sealed in a pressure-tight manner with a cover. When the housing opening is closed, the housing part and the cover are arranged in relation to each other in such a way that the central axes, in particular rotation axes, of the housing part and the cover coincide congruently. While the cover is rotated relative to the housing part, both components approach each other until the housing part is completely sealed. In particular, when the cover is screwed to the housing part, a conical sealing space is formed between the cover and the housing part, for example. When closing the housing opening of the housing part with the cover, the sealing element, for example an O-ring, comes to rest on at least one sealing surface of the housing part and is increasingly pressed with at least one sealing surface of the housing part and the at least one sealing surface of the cover.

The sealing contour can be formed by means of several sealing surfaces, partly angled to each other, optionally also provided with radii, or with a single constant radius.

The surface line of the sealing surface of the cover and the surface line of the sealing surface of the housing part can form legs of an angle which, for example, lies in the range between 1 degree and 40 degrees, in particular between 3 degrees and 15 degrees, and thus the sealing element is increasingly compressed when the housing part is closed.

For example, the surface lines of the sealing surface and in particular the legs of the angle can each be defined by a straight line between two points along the sealing contour. In particular, however, the respective sealing surface can also be described in such a way that it lies at the tangent of a section of the sealing contour. In particular, the tangent is placed through the point with the least curvature or the largest radius of the sealing contour.

A locking element can be arranged on the housing part, which, when the housing part is closed and sealed, prevents the cover from rotating and detaching from the housing part when said locking element is inserted into a suitable notch in the cover.

The locking element can be, for example, a screw that is screwed into a bore on the housing part. For example, the cover is first screwed onto the housing part or screwed into it. When fully screwed, the notch in the cover is located in the area of the locking element. The locking element can first be completely screwed into the bore and then unscrewed for safety purposes. In this case, the locking element, in particular a head of a screw, is located in the notch, for example of a groove, of the cover.

In particular, in the sealing position, it may be provided that the locking element of the housing part is covered with the notch of the cover. In addition, the cover can be rotated to one end position. The end position of the cover can indicate the sealing position or an area where the housing seals securely.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIGS. 2A and 2B show, schematically, a cross-sectional representation of a housing in an open state, FIG. 3A shows, schematically, a possible design of a housing in the open state, FIG. 3B shows, schematically, a possible design of the housing according to FIG. 3A shortly after the start of the screwing of a cover, FIG. 3C shows, schematically, a possible embodiment of the housing according to FIG. 3A in the completely closed and sealed state.

DETAILED DESCRIPTION

The angles and dimensions shown in the following figures are not drawn to scale, but only schematically. In particular, angles may be drawn larger than indicated in the text for better comprehension.

FIGS. 1A to 1D show two state-of-the-art sealing concepts, namely the so-called radial and the so-called axial sealing principle.

Figure 1A:
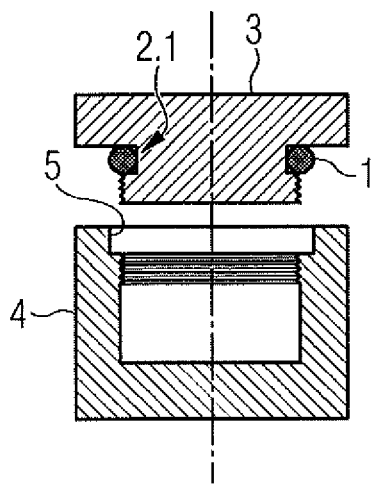
FIGS. 1A and 1B show, schematically from the prior art, a radial compression of an O-ring.
Figure 1B:
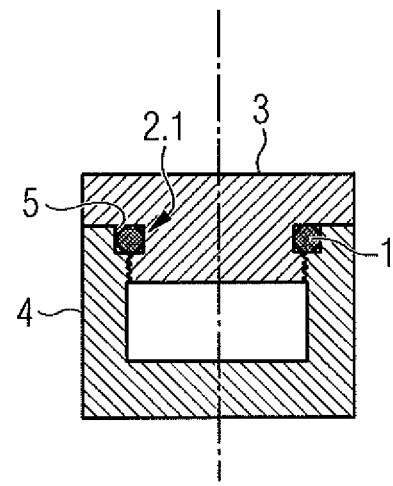

FIGS. 1A and 1B show a radial sealing principle, whereas FIG. 1A shows an open state of a housing part 4 and FIG. 1B shows the housing part 4 completely closed. In this case, an O-ring 1 lies in a groove 2.1 of a cover 3.

If the cover 3 is screwed onto or screwed into the housing part 4, the O-ring 1 is pressed with a sealing surface 5 of the housing part 4. The required force remains almost constant from the time of complete pressing of the O-ring 1. A groove base of the groove 2.1 runs parallel to the sealing surface 5 of the housing part 4.

Figure 1C:
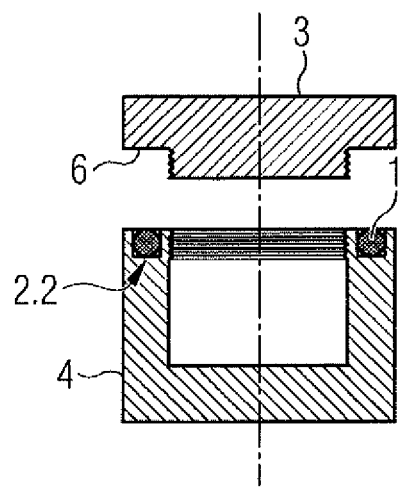
FIGS. 1C and 1D show, schematically from the prior art, an axial compression of an O-ring.
Figure 1D:
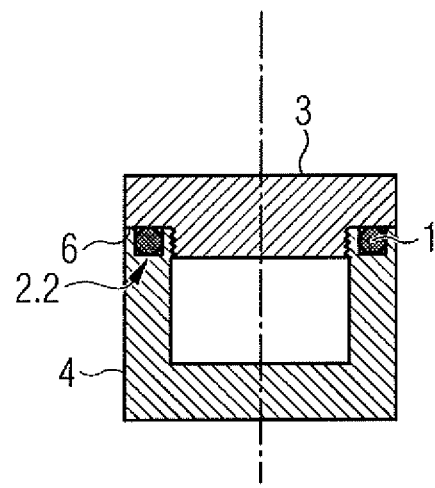

FIGS. 1C and 1D show an axial sealing principle. Here, the O-ring 1 is located in a circumferential groove 2.2 of the housing part 4. If the cover 3 is now screwed onto or screwed into the housing part 4, the cover 3 is first turned a few turns with little resistance. Only when a sealing surface 6 of the cover 3 touches the O-ring 1 and the O-ring 1 is increasingly pressed by further rotation of the cover 3 does the force to be applied increase significantly.

In this case, the sealing effect is strongly dependent on the force applied and the resulting pressing and a time in which the pressing can be maintained. Environmental influences, such as low temperatures, reduce the pressing, for example, and thus reduce the sealing effect.

FIG. 2A shows a possible embodiment of a housing 10 for a measuring instrument 11. For example, the measuring instrument 11 may be a temperature transmitter.

The measuring instrument 11 is arranged in a housing part 12, which can be closed with a cover 13. To close the housing part 12, the cover 13 is rotated around a central axis A. An external thread 22 of the cover 13 engages with a corresponding internal thread 23 of the housing part 12.

The housing part 12 has a process connection 14 and a lateral housing opening 15 for electrical wires 16.

A sealing element 18 in the form of an O-ring is placed in a conical groove 17 of the cover 13. A groove base NG forms an angle d of less than 90 degrees with a wall 20, as shown in more detail, for example, in FIG. 3A, which shows a detailed representation of a portion of the sectional representation according to FIG. 2A.

The housing part 12 has a sealing surface 21 on which the sealing element 18 comes to rest when the cover 13 is screwed on the housing part 12.

FIGS. 2B and 3A schematically show a section through a housing 10 in the open state. FIG. 2B shows an overall view of the housing 10 in section with the essential angles.

FIG. 3A shows a detailed portion of the sectional representation of the housing 10 according to FIG. 2B, in which in particular the formation of the sealing surfaces 19, 21 and the sealing element 18 become clearer.

In the following, a number of dimensions and angles are described, which can be found in both figures.

In the illustrations according to FIGS. 2B and 3A, a straight line running through a surface line of the sealing surface 19 of the cover 13 and a straight line running through the surface line of the sealing surface 21 of the housing part 12 intersect at a point P, thereby forming an angle a. For example, the angle a is in a range of 3 to 15 degrees. The sealing surface 19 of the cover 13 and the sealing surface 21 of the housing part 12 thereby correspond at least in sections to a lateral surface of a truncated circular cone, wherein the axes of symmetry of the virtual truncated circular cones surrounded by the sealing surfaces 19, 21 coincide congruently with the central axis A of the housing part 12 and the cover 13.

Furthermore, the angles b and c to the central axis A can also be determined. The angle b is formed between the straight line of the sealing surface 21 of the housing part 12 and the axis A. The angle c is accordingly enclosed between the straight line of the sealing surface 19 of the cover 13 and the central axis A. The angle c is greater than the angle b. The angle c can be about 15 degrees and the angle b about 10 degrees.

The sealing element 18 with a diameter D is located in the conical groove 17. The conical groove 17 is defined on the one hand by a depth T and on the other hand by the dimension of a groove base NG. The dimension of the groove base NG determines how much freedom of movement the sealing element 18 has in the groove 17. Ideally, the dimension of the groove base NG is equal to the diameter D of the sealing element 18 or only slightly larger. An angle d is enclosed between the depth T and the surface line of the sealing surface 19.

FIG. 3B schematically shows a section of the housing 10 according to FIG. 3A at the beginning of the screw connection. First thread pitches of a thread 23 of the housing part 12 and a thread 22 of the cover 13 are engaged with each other. The sealing element 18 comes to rest on the sealing surface 21. The intersection P shifts downwards on the housing part 12, parallel to the screw connection of the cover 13. In the further course, the cover 13 is further screwed until the housing part 12 is completely screwed and sealed.

FIG. 3C schematically shows a section of the housing 10 according to FIG. 3A with the housing part 12 completely closed by the cover 13.

The groove 17, together with the sealing surface 21 of the housing part 12, forms a sealing space in which the sealing element 18 is enclosed and maximally pressed. For example, the sealing element 18 is pressed in such a way that as much contact surface as possible is created between it and the sealing surface 19, i.e., of the groove 17, and the sealing surface 21.

FIG. 3C also shows that the dimension of the groove base NG corresponds approximately to the diameter of the pressed sealing element 18.

Figure 4A:
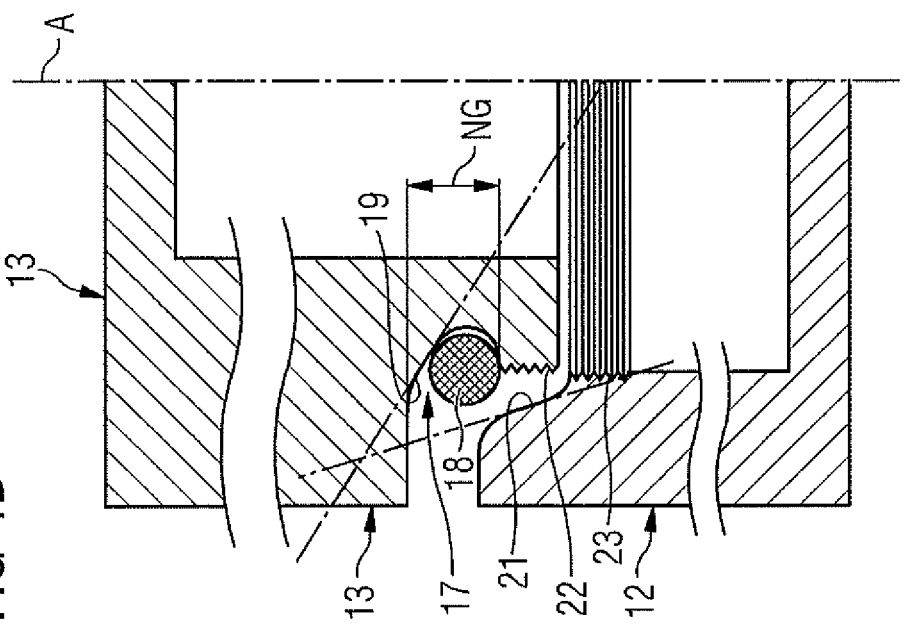
FIG. 4A shows, schematically, a possible design of sealing surfaces and/or sealing contours of a housing.

FIG. 4A shows an alternative embodiment of the groove 17 of the cover 13. The housing part 12 is shown in the unsealed state. The cover 13 and the housing part 12 can be designed of almost any size, each of which is illustrated by two breaking edges.

The sealing surface 19 of the cover 13 is parallel to axis A. In particular, the sealing surface 19 is a lateral surface of a cylinder and runs coaxially around the axis A. For example, the dimension of the groove base NG is a maximum of 50 percent larger than a diameter D of the sealing element 18, which is designed as an O-ring, in the unpressed state.

Figure 4B:
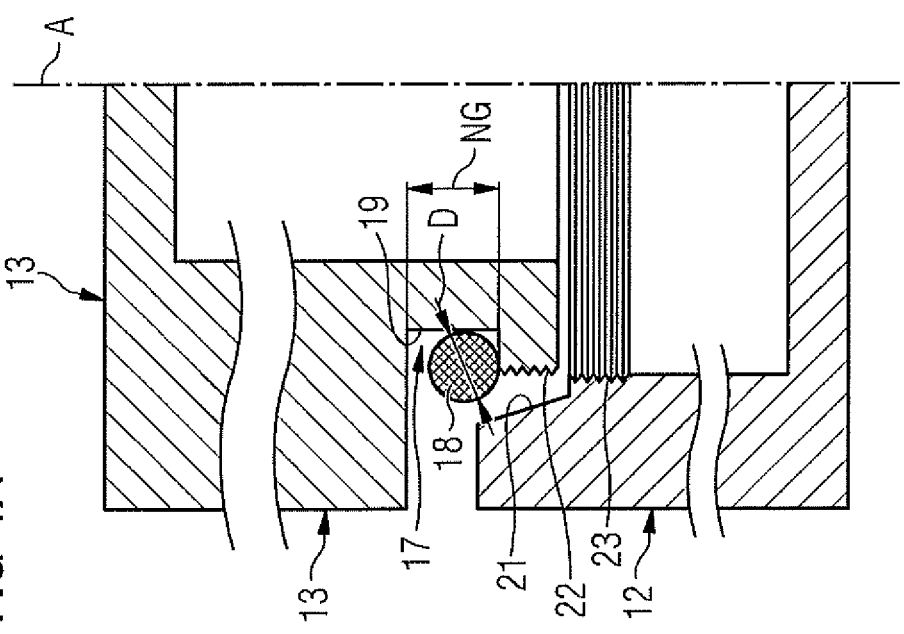
FIG. 4B shows, schematically, another embodiment of sealing surfaces and/or sealing contours of a housing.

FIG. 4B shows a further embodiment of a housing seal 10, in particular an embodiment of sealing contours on the cover 13 and housing part 12. The groove 17 is not formed from straight surfaces, but from one or more contours. Thus, it is possible that the radius of the sealing element 18 designed as an O-ring is also a radius of a partial contour of the groove 17.

In FIG. 4B shown, the sealing contour, which adjoins the thread 22, is initially more curved. As it progresses, the curvature decreases until it turns into a straight, uncurved surface in the horizontal. In the case of the sealing contour of the housing part 12, the edges of the sealing surface 21 are rounded and an S-shaped sealing contour is obtained.

In FIG. 4B, no clear straight sealing surfaces 19, 21 are defined as compared to the previous figures. The relevant sealing surface 19, 21 is alternatively defined by placing a tangent along the sealing contour through the point with the least curvature. In extreme cases, it can also be a section of the sealing contour without curvature, as can be seen in FIG. 4B at the sealing contour 21 of the housing part 12.

Figure 4C:
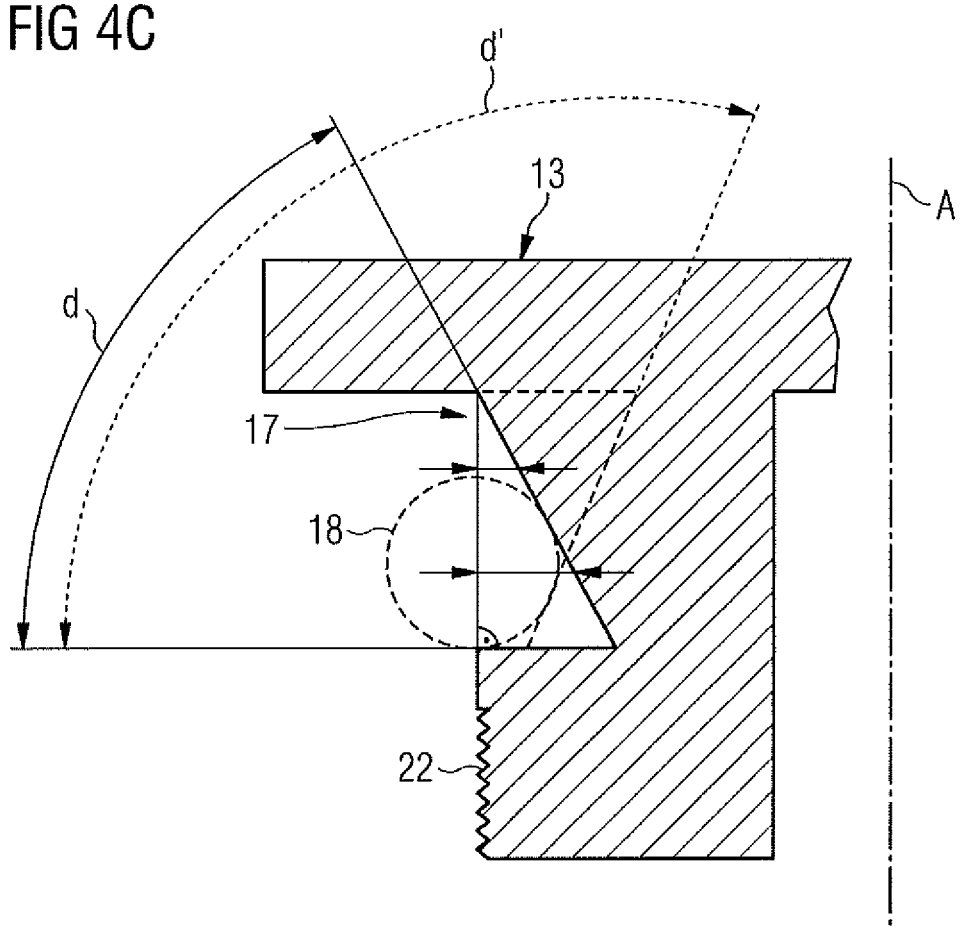
FIG. 4C shows, schematically, an embodiment of the sealing surface and/or a sealing contour of a cover of a housing.

FIG. 4C shows another embodiment of the cover 13 with the conical groove 17. The sealing element 18, which is designed as an O-ring, is only schematically indicated. In particular, FIG. 4C is intended to show that the groove design of the cover 13 is also possible with an obtuse angle d' instead of an acute angle d.

Figure 5A:
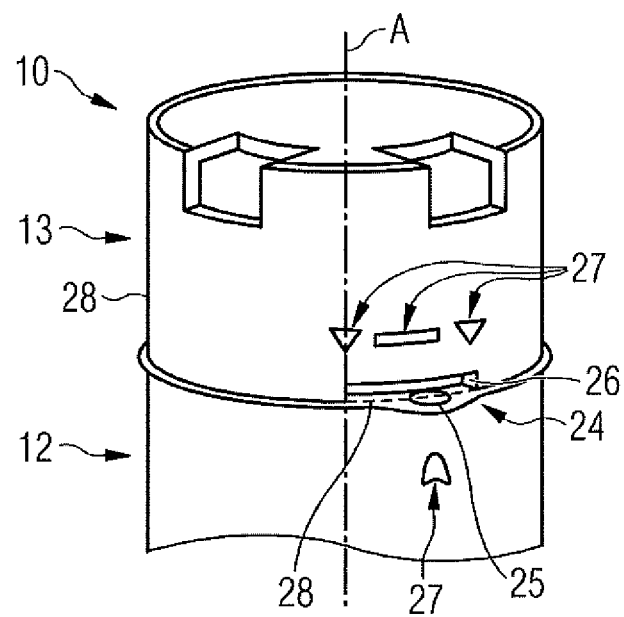
FIG. 5A shows, schematically, an embodiment of a housing with an anti-rotation device.

FIG. 5A schematically shows a housing 10 with a cover 13 and a housing part 12 as well as an embodiment of an anti-rotation device 24.

For this purpose, a bore 25, in particular a threaded bore, is formed in the housing 12. The bore 25 is provided so that a screw 29, which is shown in more detail in FIG. 5C, can be screwed into it. For example, the bore 25 is designed in such a way that a screw head of the screw 29 is completely submersible.

A groove 26 is formed on a side wall 28 on the outer circumference of the cover 13. The length of the groove 26 can be about 20 degrees to 80 degrees of the circumference.

When the cover 13 is fully screwed to the housing part 12, the bore 25 is in the area of the groove 26. To adjust the anti-rotation device 24, the previously sunken screw 29 is unscrewed upwards into the groove 26. The cover 13 can be rotated to a maximum extent until the unscrewed screw 29 hits a side wall of the groove 26.

In addition, optical markings 27 may be arranged above the groove 26 and below the bore 25. These serve as a visual indicator to mark an area where the housing is securely sealed. Outside this range, the sealing effect is not maximum.

Figure 5B:
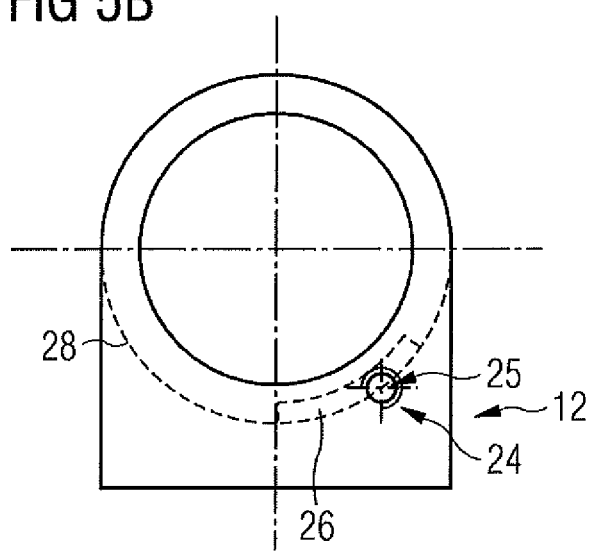
FIG. 5B shows, schematically, a top view of the housing according to FIG.

FIG. 5B shows a top view of the embodiment of the housing 10 shown in FIG. 5A with the anti-rotation device 24. The bore 25 lies slightly within the indicated side wall 28 of the cover 13 and ends approximately with the indicated groove 26.

Figure 5C:
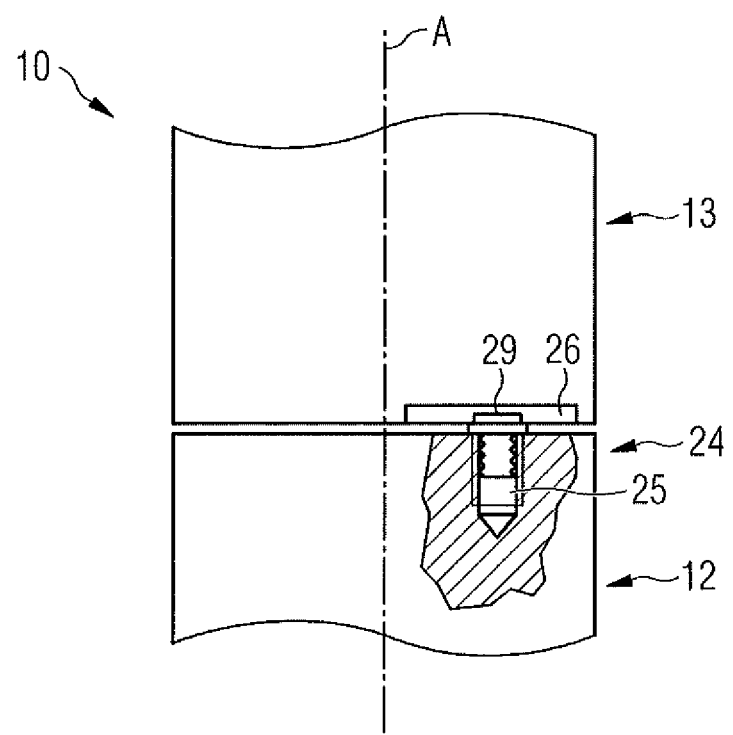
FIG. 5C shows, schematically, a front view of the housing according to FIG.

FIG. 5C shows a front view of the embodiment of the housing 10 with the anti-rotation device 24 shown in FIG. 5A.

If the groove 26 is located in the area of the bore 25, a screw 29 can be unscrewed upwards from the bore 25 so that the screw head of the screw 29 protrudes into the groove 26. Further rotating of the cover 13 is prevented at the latest when the screw head of the screw 29 rests on a side wall of the groove 26.

The invention is not limited to the preceding detailed embodiments. It can be modified to the extent of the following claims. Individual aspects from the subclaims can also be combined with each other.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A housing for a measuring instrument, the housing comprising:
   a housing part;
   a cover adapted to be connected to the housing part in a detachable manner and via which a housing opening of the housing part is closeable; and
   a sealing element,
   wherein the housing part has a central axis, which is an axis of rotation, that coincides congruently with a central axis of the cover when closed,
   wherein the cover has at least one sealing surface on which the sealing element comes to rest at least when the housing part is completely closed,
   wherein the housing part has at least one sealing surface on which the sealing element comes to rest when the housing part is closed with the cover,
   wherein a surface line of the at least one sealing surface of the housing part is interlaced with the central axis of the housing part and/or a surface line of the at least one sealing surface of the cover is interlaced with the central axis of the cover, at least when the housing part is completely closed, and
   wherein at least one section of the at least one sealing surface of the housing part and/or at least one section of the at least one sealing surface of the cover correspond to a lateral surface of a truncated circular cone, and wherein an axis of symmetry of the truncated circular cone surrounded by the corresponding sealing surface coincides congruently with the central axis of the housing part and/or the cover.

2. The housing according to claim 1, wherein an angle is formed between the surface line of the at least one section of the at least one sealing surface of the cover and the surface line of the at least one section of the at least one sealing surface of the housing part, the angle being in a range of 1 degree to 40 degrees or 3 degrees to 15 degrees.

3. The housing according to claim 2, wherein the at least one sealing surface of the cover is formed as a conical circumferential groove.

4. The housing according to claim 3, wherein a cross-section of the conical circumferential groove of the cover decreases, resulting in an angle, between a side wall of the circumferential groove and a groove base, of less than 90 degrees.

5. The housing according to claim 1, wherein the at least one sealing surface of the housing part runs coaxially to the central axis of the housing part, at least in sections.

6. The housing according to claim 1, wherein the at least one sealing surface of the housing part is formed as a conical recess or as a chamfer.

7. The housing according to claim 1, wherein the sealing element is an O-ring made of silicone or rubber or a thermoplastic elastomer.

8. The housing according to claim 1, wherein the cover can be secured or is secured against rotating when the housing part is sealed.

9. The housing according to claim 8, wherein in the closed state of the housing part, a locking element, which is rotatably arranged on the housing part can be inserted or is inserted into a notch in the cover.

10. The housing according to claim 1, wherein an intersection area of the surface lines of the at least one sealing surface of the housing part and the at least one sealing surface of the cover is formed with the housing opening not closed by the cover, but with the cover arranged above the housing opening in the mounting direction, so that the central axis of the housing part coincides with the central axis of the cover, wherein the intersection area is located outside the housing part and outside the cover.

11. The housing according to claim 1, wherein an intersection area of the surface lines of the at least one sealing surface of the housing part and the at least one sealing surface of the cover is located within the housing part when the housing opening is closed by the cover.

12. A method for sealing a housing having a housing part, a cover adapted to be connected to the housing part in a detachable manner and via which a housing opening of the housing part is closeable, and a sealing element, the housing part having a central axis, which is an axis of rotation, that coincides congruently with a central axis of the cover when closed, the cover having at least one sealing surface on which the sealing element comes to rest at least when the housing part is completely closed, the housing part having at least one sealing surface on which the sealing element comes to rest when the housing part is closed with the cover, and a surface line of the at least one sealing surface of the housing part being interlaced with the central axis of the housing part and/or a surface line of the at least one sealing surface of the cover being interlaced with the central axis of the cover, at least when the housing part is completely closed, the method comprising:
   closing the housing opening of the housing part with the cover in a pressure-tight manner;
   arranging, when the housing opening is closed, the housing part and the cover with respect to each other such that the central axis of the housing part and the central axis of the cover coincide congruently; and
   rotating the cover relative to the housing part,
   wherein, there is a sealing space between the cover and the housing part and when closing the housing opening of the housing part with the cover, the sealing element comes to rest on the at least one sealing surface of the housing part and is increasingly pressed with the at least one sealing surface of the housing part and the at least one sealing surface of the cover, and
   wherein a locking element arranged on the housing part is inserted into a complementary notch in the cover such that rotating and loosening of the cover is prevented in the closed and sealed state of the housing opening.

13. The method according to claim 3, wherein the cover is rotated relative to the housing part to an end position, and wherein a sealing position is achieved in the end position in which the locking element of the housing part is covered with the notch of the cover.

* * * * *